United States Patent
Assaderaghi et al.

(10) Patent No.: US 6,657,261 B2
(45) Date of Patent: Dec. 2, 2003

(54) GROUND-PLANE DEVICE WITH BACK OXIDE TOPOGRAPHY

(75) Inventors: Fariborz Assaderaghi, Mahopac, NY (US); Tze-chiang Chen, Yorktown Heights, NY (US); K. Paul Muller, Wappingers Falls, NY (US); Edward J. Nowak, Essex Junction, VT (US); Devendra K. Sadana, Pleasantville, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,317

(22) Filed: Jan. 9, 2001

(65) Prior Publication Data

US 2002/0090768 A1 Jul. 11, 2002

(51) Int. Cl.[7] .................. H01L 27/01; H01L 27/12; H01L 31/0392
(52) U.S. Cl. .................. 257/354; 257/349; 257/401; 257/623
(58) Field of Search .................. 257/345, 347, 257/349, 353, 354, 401, 623

(56) References Cited

U.S. PATENT DOCUMENTS

| | | | |
|---|---|---|---|
| 3,853,633 A | 12/1974 | Armstrong | 438/217 |
| 4,222,062 A | 9/1980 | Trotter et al. | 257/316 |
| 4,393,578 A | 7/1983 | Cady et al. | 438/149 |
| 4,839,707 A | 6/1989 | Shields | 257/350 |
| 4,951,123 A | 8/1990 | Lee et al. | 257/720 |
| 5,166,765 A | 11/1992 | Lee et al. | 257/345 |
| 5,273,921 A * | 12/1993 | Neudeck et al. | 257/E29.275 |
| 5,285,352 A | 2/1994 | Pastore et al. | 361/707 |
| 5,376,578 A | 12/1994 | Hsu et al. | 438/289 |
| 5,780,912 A | 7/1998 | Burr et al. | 257/408 |
| 5,893,745 A * | 4/1999 | Park | 438/412 |
| 6,008,126 A | 12/1999 | Leedy | 438/667 |
| 6,057,555 A | 5/2000 | Reedy et al. | 257/9 |
| 6,074,920 A | 6/2000 | Houston | 438/289 |
| 6,242,778 B1 * | 6/2001 | Marmillion et al. | 257/347 |
| 6,255,145 B1 * | 7/2001 | Ajmera et al. | 438/149 |
| 6,287,901 B1 * | 9/2001 | Christensen et al. | 257/347 |
| 6,337,505 B2 * | 1/2002 | Hwang et al. | 257/347 |
| 6,365,465 B1 * | 4/2002 | Chan et al. | 438/283 |

OTHER PUBLICATIONS

Skotnicki, T., et al., "Heavily doped and extremely shallow junctions on insulator by Sonction (SilicON Cut–off junction) process", IEEE Electronic Library, Electron Devices Meeting 1999, IEDM Technical Digest, International, pp. 513–516, (1999).

Yan, R.H., et al., "High performance 0.1–mu m room temperature Si MOSFETs", IEEE Electronic Library, VLSO Technology, 1992. Digest of Technical Papers. 1992 Symposium on, p. 86–87, (1992).

* cited by examiner

Primary Examiner—Amir Zarabian
Assistant Examiner—Jamie L. Brophy
(74) Attorney, Agent, or Firm—Steven Fischman

(57) ABSTRACT

A ground-plane SOI device including at least a gate region that is formed on a top Si-containing layer of a SOI wafer, said top Si-containing layer being formed on a non-planar buried oxide layer, wherein said non-planar buried oxide layer has a thickness beneath the gate region that is thinner than corresponding oxide layers that are formed in regions not beneath said gate region as well as a method of fabricating the same are provided.

12 Claims, 4 Drawing Sheets

GROUND-PLANE DEVICE WITH BACK OXIDE TOPOGRAPHY

FIELD OF THE INVENTION

The present invention relates to semiconductor devices, and more particularly to a ground-plane device which includes a field effect transistor (FET) that is formed on a silicon-on-insulator (SOI) wafer. Additionally, the present invention provides a method of fabricating a ground-plane device in which the short channel effects typically present in such devices have been substantially eliminated.

BACKGROUND OF THE INVENTION

In semiconductor processing, SOI technology is becoming increasingly more important since it permits the formation of high-speed integrated circuits. In SOI technology, a relatively thin layer of semiconducting material, e.g., Si, overlays a layer of insulating material, e.g., a buried oxide region. This relatively thin layer of semiconducting material is generally the area wherein active devices such as field effect transistors (FETs) are formed in the SOI wafer. Devices formed on SOI offer many advantages over their bulk Si counterparts including higher performance, absence of latch-up, higher packing density and lower voltage applications.

Despite the advantages obtained using SOI technology, SOI technology suffers from short channel effects which are also present in bulk Si technology. As is known to those skilled in the art short channel effects tend to degrade the electronic integrity of the device and lead to unacceptable device leakage current known in the art as 'off-current'. Short channel effects are more pronounced in very large scale integration (VSLI) devices wherein the channel length is less than 1 $\mu$m.

In view of the short channel effect problem mentioned above with SOI devices, there is a continued need for developing a new and improved SOI device which substantially eliminates the short channel effects.

SUMMARY OF THE INVENTION

One object of the present invention is to provide a ground-plane device that has a topography that is not planar.

Another object of the present invention is to provide a ground-plane device in which the advantages of both ground-plane devices and SOI devices are achieved in a single device.

A further object of the present invention is to provide a ground-plane SOI device in which the deep source/drain perimeter junction capacitance is substantially eliminated, and the area component of the junction capacitance is reduced compared to conventional ground-plane devices.

These and other objects and advantages are achieved in the present invention by providing a ground-plane SOI device in which the buried oxide layer of the device has been modified, i.e., etched, to have a topography that is not planar. The buried oxide layer of the present invention is distinct from a conventional buried oxide layer in that it is not planar and does not have a specific thickness like a conventional buried oxide layer. Moreover, the non-planar buried oxide layer of the present invention layer has a thickness that is smaller under the gate region as compared to the combined thickness of corresponding oxide layers that are formed on a recessed surface of a Si substrate of a SOI wafer in regions below the source/drain regions.

In one aspect of the present invention, a method of forming a ground-plane SOI device having a non-planar buried oxide layer is provided. Specifically, the method of the present invention comprises the steps of:

(a) implanting a ground-plane doping region into a top portion of a Si substrate of a silicon-on-insulator (SOI) wafer, said SOI wafer having a buried oxide layer formed on said Si substrate and a top Si-containing layer formed on said buried oxide layer;

(b) forming a gate region on a portion of said top Si-containing layer of said SOI wafer, said gate region including a gate dielectric formed on said top Si-containing layer, a gate conductor formed on said gate oxide and a hard mask formed on said gate conductor;

(c) forming halo implant and source/drain extension regions in said top Si-containing layer of said SOI wafer;

(d) forming first spacers on said gate dielectric so as to protect vertical sidewalls of said gate conductor and said hard mask;

(e) removing portions of said top Si-containing layer of said SOI wafer so as to expose portions of said buried oxide layer;

(f) etching said exposed buried oxide layer so as to form a non-planar buried oxide layer;

(g) forming second spacers on said non-planar buried oxide layer so as to protect said first spacers and exposed vertical sidewalls of said top Si-containing layer;

(h) removing exposed portions of said non-planar buried oxide layer so as to expose underlying portions of said Si substrate of said SOI wafer;

(i) recessing exposed portions of said Si substrate and providing a lateral undercut region in said Si substrate beneath said gate region;

(j) forming an oxide liner on all exposed surfaces of said Si substrate and filling said recess and said undercut region with an oxide fill material, said oxide fill material and said oxide liner having a combined thickness that is greater than the thickness of the non-planar buried oxide layer under said gate region; and (k) removing said second spacers and forming doped polysilicon spacers in areas previously occupied by said second spacers.

After conducting steps (a)–(k) above, conventional complementary metal oxide processing steps may be carried out in providing the final grounded plane SOI device. In a preferred embodiment of the present invention, the following processing steps follow steps (a)–(k) above:

(l) forming an epi polysilicon layer on said oxide fill material provided in step (j); and (m) removing said hard mask from said gate conductor and siliciding said gate conductor and said epi polysilicon layer.

The present invention also provides a ground-plane SOI device which comprises at least a gate region that is formed on a top Si-containing layer of a SOI wafer, said top Si-containing layer being formed on a non-planar buried oxide layer, wherein said non-planar buried oxide layer has a thickness beneath the gate region that is thinner than corresponding oxide layers that are formed in regions not beneath said gate region.

DETAILED DESCRIPTION OF THE INVENTION

Figure 1:
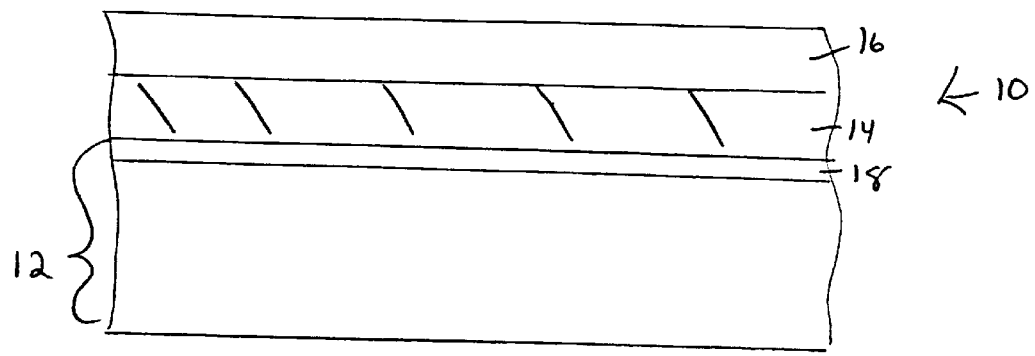
FIGS. 1–9 show the basic processing steps of the present invention that are employed in forming the inventive ground-plane device.

The present invention, which provides a ground-plane structure and a method of fabricating the same, will now be described in more detail by referring to the drawings that accompany the present application.

Reference is first made to FIGS. 1–9 which show the basic processing steps that are employed in the present invention in fabricating a ground-plane structure in which the buried oxide layer and the Si substrate of the SOI wafer are non-planar. Specifically, FIG. 1 shows an initial structure of the present invention after implanting ground-plane doping region 18 into a top portion of Si substrate 12 of silicon-on-insulator (SOI) wafer 10. As further shown, SOI wafer 10 includes buried oxide layer 14 formed on Si substrate 12 and top Si-containing layer 16 formed on the buried oxide layer. The SOI wafer employed in the present invention may be fabricated using well known techniques known to those skilled in the art including: SIMOX (separation by implantation of oxygen) or bonding. Of these various techniques, it is preferred that SOI wafer 10 be formed by a SIMOX process wherein a buried oxide having a thickness of from about 20 to about 25 nm is formed using a low-energy (on the order of about 60 eV or below) $O_2$ implant, followed by a high temperature (on the order of about 1300° C.) anneal.

Ground-plane doping region 18 is formed by a conventional ion implantation process wherein a dopant of a first conductivity type (either n-type or p-type) is implanted into a top portion of Si substrate 12. The type of dopant used in this implant step depends on the type of device to be fabricated. When a pFET (field effect transistor) is the desired device to be fabricated, a n-type dopant is employed. On the other hand, when a nFET is the desired device, a p-type dopant is employed. The conditions for this implant step vary depending on the type of dopant employed. Typically, when a nFET is to be formed, a n-type dopant having a concentration of 1E19 atoms/cm$^3$ will be employed.

Figure 2:
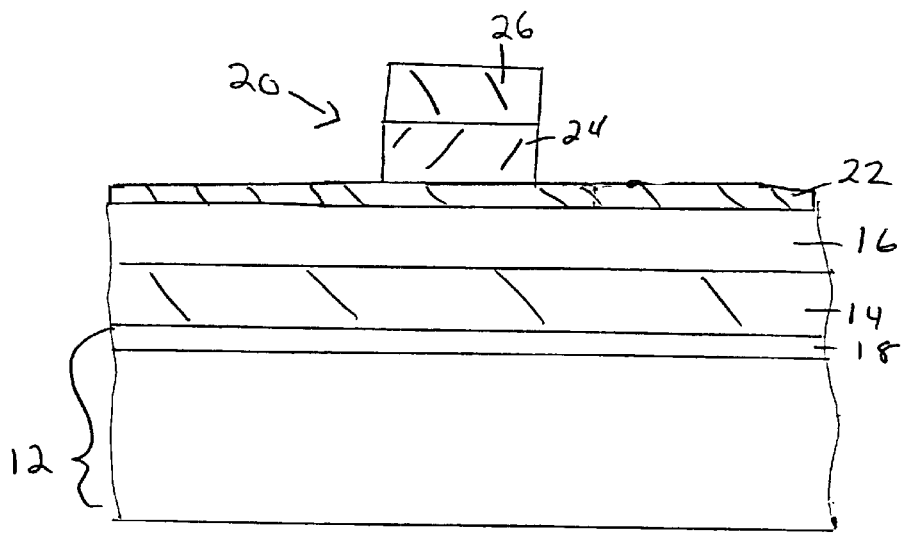

FIG. 2 shows the next step of the present invention wherein gate region 20 (including gate dielectric 22, gate conductor 24 and hard mask 26) is formed on a portion of the top Si-containing layer of the SOI wafer. Specifically, gate region 20 is formed by first forming a layer of a gate dielectric material such as an oxide (e.g., $SiO_2$, $Al_2O_3$, $HfO_2$ and $ZrO_2$), nitride or oxynitride on the surface of top Si-containing layer 16.

The layer of gate dielectric material may be formed by utilizing a conventional deposition process such as chemical vapor deposition (CVD), plasma-assisted CVD, sputtering or chemical solution deposition or, alternatively, the layer of gate dielectric material may be grown utilizing a conventional thermal growing process. The thickness of the layer of gate dielectric material may vary, but typically, the gate dielectric has a thickness of from about 0.6 to about 2.0 nm.

Following the above processing steps, gate conductor 24 is formed on the surface of gate dielectric 22 utilizing a conventional deposition process including, but not limited to: CVD, plasma-assisted CVD, sputtering, and other like deposition processes. The gate conductor may be composed of any conductive material including, but not limited to: W, W/Ni, doped polysilicon, and combinations thereof. When doped polysilicon is employed as the gate conductor, the doped polysilicon may be formed by a conventional in-situ doping deposition process, or alternatively, deposition followed by ion implantation may be employed. The thickness of the gate conductor may vary and is not critical to the present invention.

Next, hard mask 26 which may be composed of an oxide (e.g., $SiO_2$), a nitride (e.g., $Si_3N_4$) or a carbide (e.g., SiC) is formed on the surface of gate conductor 24 utilizing a conventional deposition process such as CVD. The thickness of the hard mask may vary and is also not critical to the present invention.

After forming the hard mask on the gate conductor, conventional lithography and etching such as reactive ion etching (RIE) are employed in forming gate region 20. The etching step stops at the gate insulator level. It is noted that an optional reoxidation process utilizing conditions well known to those skilled in the art may follow the etching step. Moreover, it is noted that this etching step of the present invention may remove only portions of the hard mask and the gate conductor, or it may remove portions of the gate dielectric as well.

Figure 3:
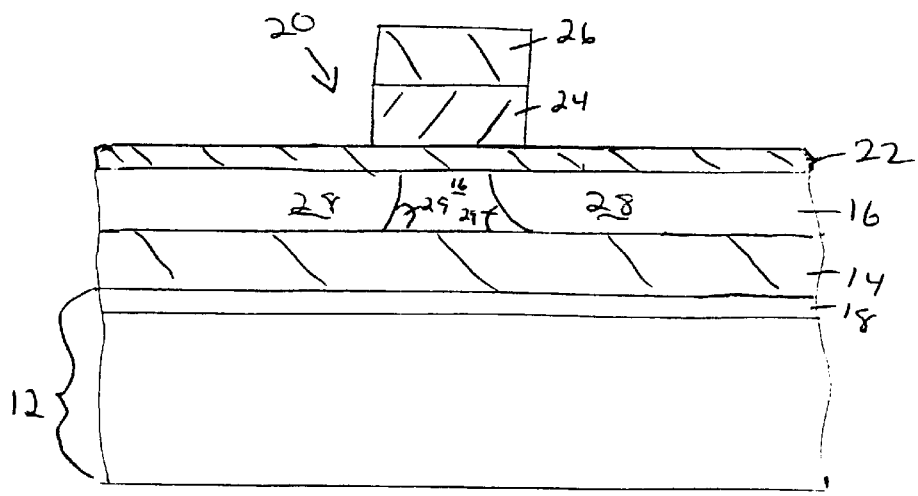

In accordance with the next step of the present invention, extension implants and halo implants are then performed utilizing conventional ion implantation processes well known to those skilled in the art. The conditions of these implants may vary depending on the type of device to be formed. Typically, when a nFET is to be fabricated, the extension implant utilizes a n-type dopant having a concentration of about 1E20 atoms/cm$^3$, while p-type dopants, such as boron, having a concentration of about 1E18 atoms/cm$^3$ are used during the halo implant. FIG. 3 shows the structure after conducting these implant steps wherein reference numeral 28 is used to denote the extension implant regions and reference numeral 29 is used to denote the halo implant region.

Figure 4:
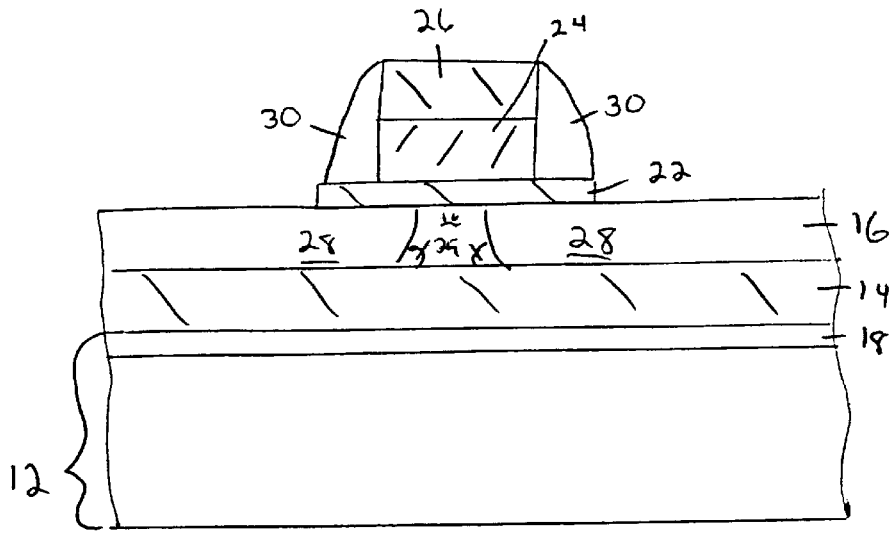

After conducting the above-mentioned extension and halo implants, first spacers 30 are formed adjacent to the gate stack, e.g., layers 26 and 24, so as to protect any exposed vertical sidewalls of the gate conductor and the hard mask, and to create an offset to the edge of extension region 28, See FIG. 4. The first spacers, which may be composed of a conventional insulating material such as an oxide or nitride, are formed by a conventional deposition process and etching.

Figure 5:
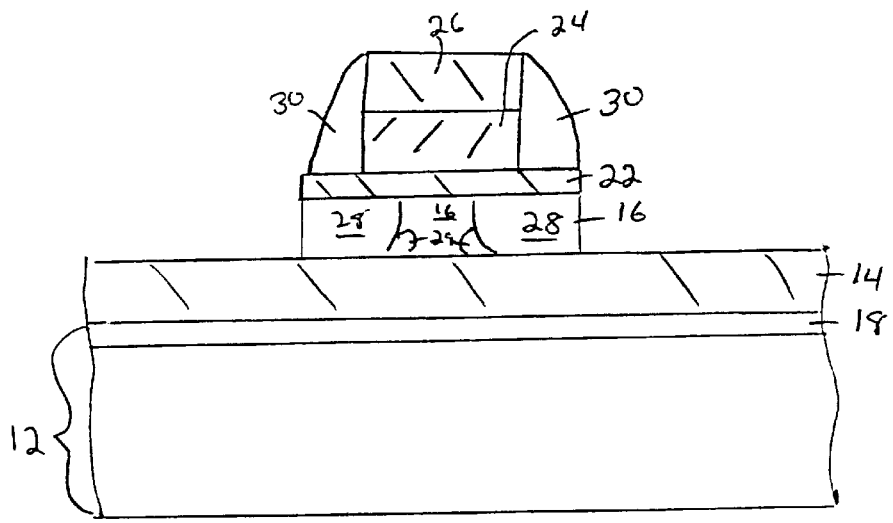

FIG. 5 shows the structure that is obtained after removing portions of the top silicon-containing layer 14 of SOI wafer 10 so as to expose portions of buried oxide layer 16. Specifically, this processing step of the present invention removes any top Si-containing layer 16 in the source/drain regions (to be subsequently formed) that is not covered by gate region 20 and first spacers 30 stopping on the underlying buried oxide layer of the SOI wafer. In accordance with the present invention, this removal process is achieved by utilizing any conventional etching process such as RIE that is selective to the spacer and hard mask materials.

Figure 6:
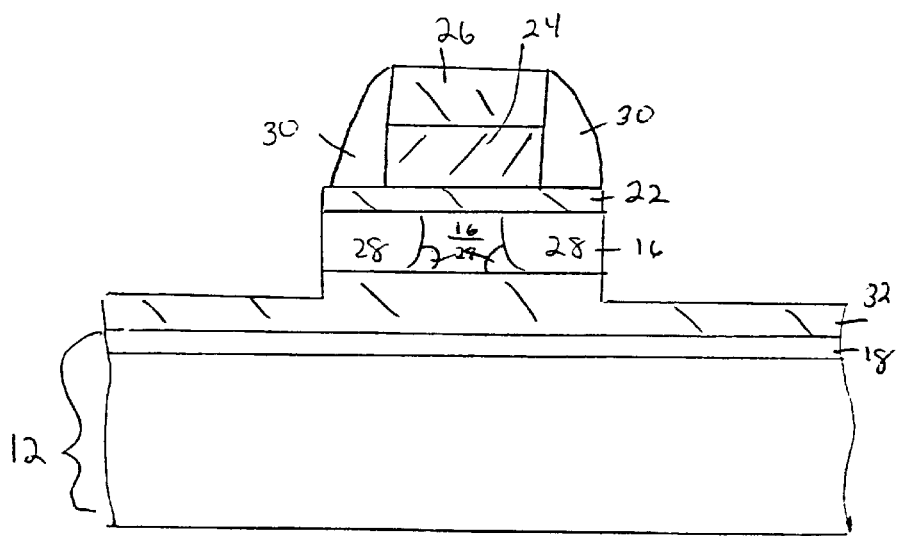
Figure 7:
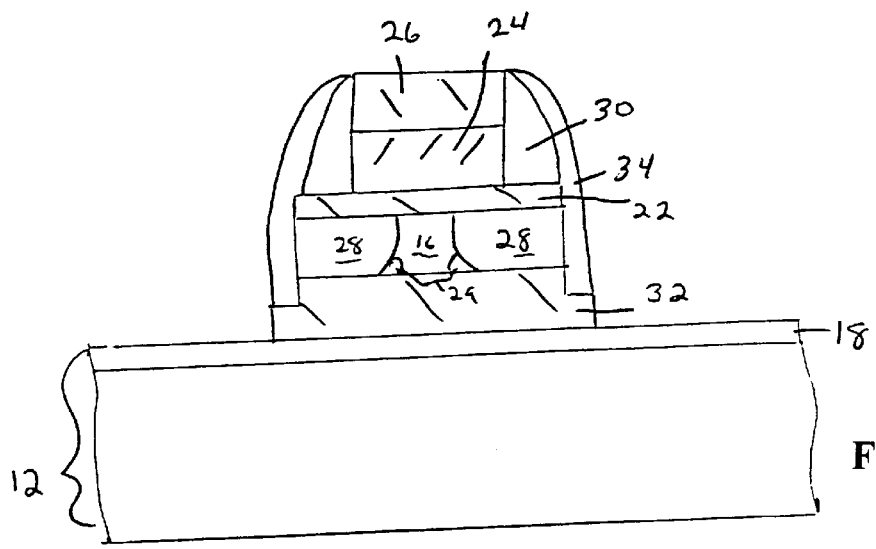

FIG. 6 shows the structure that is obtained after conducting a conventional anisotropic etching step. Specifically, this etching step of the present invention is a timed etching step wherein portions of the exposed buried oxide layer are removed so as to form a non-planar buried oxide layer 32. Although various times can be employed (dependent on the thickness of the buried oxide layer), it is preferred that the etching be carried out for a time period of from about 30 to about 60 seconds or less.

Figure 9:
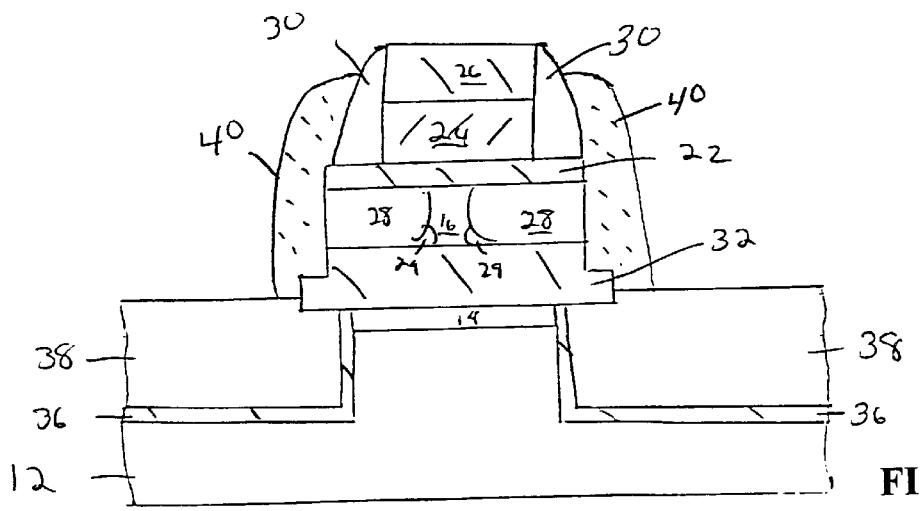

Next, the structure shown in FIG. 6 is subjected to the following processing steps that lead to the formation of the ground-plane SOI device shown in FIG. 9. Specifically, after etching a portion of the buried oxide layer so as to form the structure shown in FIG. 6, second spacers 34 which have a width that is narrower than the first spacers are formed on portions of non-planar buried oxide layer 32 that abut the gate region as well as on first spacers 30. With second spacers 34 in place, the exposed portions of non-planar buried oxide layer 32 in the source/drain regions (to be subsequently formed) are removed by a selective etching process that is capable of stopping on Si substrate 12. Typically, an anisotropic RIE process is employed for selectively removing the exposed portions of non-planar buried oxide layer 32. The above steps form the structure shown in FIG. 7.

Figure 8:
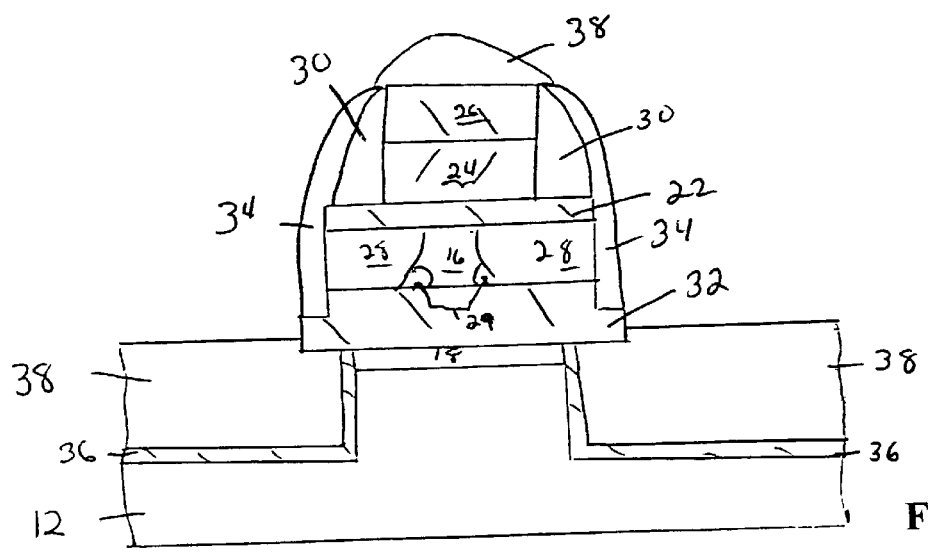

Next, the exposed portions of the Si substrate are recessed utilizing a conventional RIE process followed by a lateral etching process so as to provide an undercut region in the recessed Si substrate that extends beneath the gate region of the structure, See FIG. 8. Specifically, the lateral etching process is a self-aligned isotropic etching process that stops at approximately the area where the extensions in the top Si-containing layer end. This undercut is important in the present invention since it reduces the capacitance of the device. It should be noted that although the undercut region is shown in the drawings as having substantially vertical sidewalls, the present invention also contemplates an undercut region wherein the sidewalls have some degree of corner rounding associated therewith.

Next, and as also shown in FIG. 8, liner material 36 such as an oxide is formed by a conventional deposition or thermal growing process on all exposed portions of the Si substrate and thereafter a high density plasma (HDP) oxide 38 or other like oxide fill material is formed so as to fill the undercut region as well as the recessed region provided above. It is noted that when high-density plasma oxide is employed, oxide fill material layer 38 (See, FIG. 8) also forms on the horizontal surface of the hard mask.

FIG. 9 shows the structure that is obtained after removing second spacers 34 from the structure, conducting an optional cleaning step and forming doped polysilicon spacers 40 on oxide fill material layer 38 in regions that abut the gate region. Specifically, second spacers 34 are removed by a conventional isotropic etching process, e.g., a wet chemical etch process. When employed, the cleaning step includes the use of HF acid. Insofar as doped polysilicon spacers 40 are concerned, those spacers are formed by a conventional in-situ deposition process and etching, or alternatively by deposition, etching and ion implantation. In accordance with the present invention, doped polysilicon spacers 40 serve as the source and drain regions of the device. It is noted that non-planar buried oxide layer 32 has a thickness beneath the gate region that is thinner than oxide region 38 and oxide liner 36 which is not beneath the gate region. That is, the combined thickness of oxide layers 36 and 38 under doped polysilicon regions 40 is greater than the thickness of the non-planar oxide layer that is present beneath the gate region of the device. Typically, in the present invention, the oxide cap on the gate region is removed prior to forming doped spacers 40.

Conventional CMOS (complementary metal oxide semiconductor) processing steps that are well known to those skilled in the art may now be carried out utilizing the structure shown in FIG. 9. That is, the structure shown in FIG. 9 may be subjected to contact formation, silicidation and other conventional CMOS processing steps.

Figure 10:
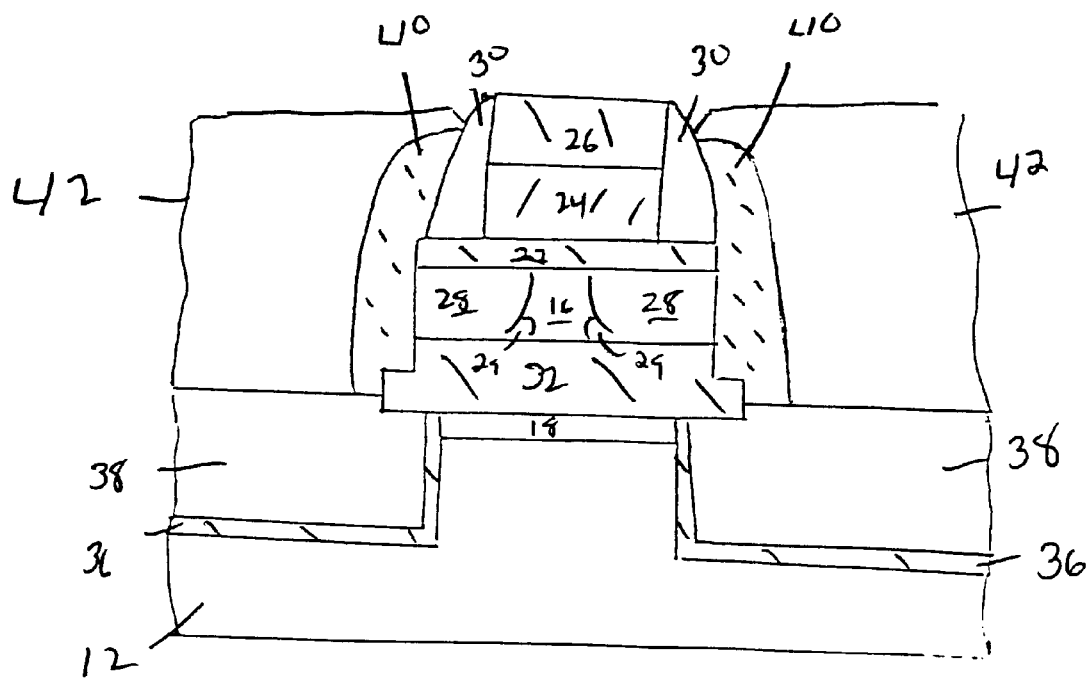
FIGS. 10–11 show additional processing steps that are employed in a preferred embodiment of the present invention.

In a preferred embodiment of the present invention, the following processing steps are carried out on the structure shown in FIG. 9: Next, oxide fill material layer 38 is subjected to a conventional etching process such as RIE so as to remove portions thereof in the previously recessed area. A selective epi deposition process well known to those skilled in the art is then employed so as to form epi polysilicon fill regions 42, See FIG. 10.

Figure 11:
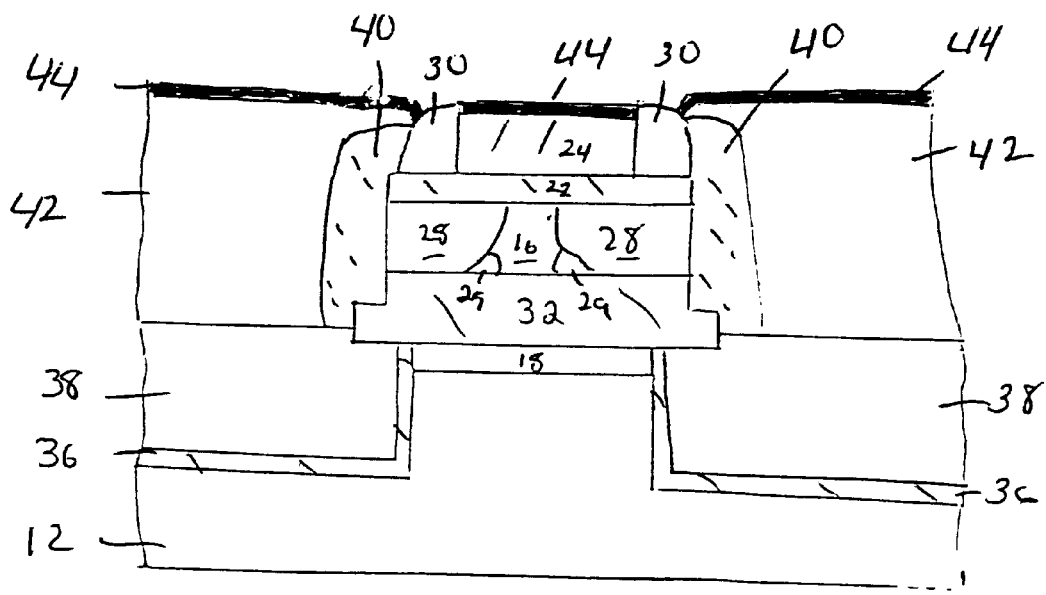

The next steps of the invention provide the structure shown in FIG 11. Specifically, hard mask 26 is removed utilizing a selective etching process, and thereafter the exposed surfaces of the epi filled region as well as the gate conductor are subjected to a conventional siliciding process which is capable of forming suicide regions 44 in the structure. Typically, the siliciding process is carried out at a temperature of about 700° C. or greater for a time period of about 60 seconds or less.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A ground-plane silicon-on-insulator (SOI) device comprising:
   a source region, at least one gate region, and a drain region, said at least one gate region being formed on a top Si-containing layer of an SOI wafer, said top Si-containing layer being formed on a non-planar buried oxide layer having stepped side regions, said non-planar buried oxide layer having a thickness beneath said at least one gate region includes a gate dielectric and a gate conductor, said gate conductor being formed on said gate dielectric, and wherein a silicide region is formed on said gate conductor.

2. The ground-plane SOI device of claim 1 wherein said gate dielectric is an oxide and said gate conductor is doped polysilicon.

3. The ground-plane SOI device of claim 1 wherein regions adjacent to said gate region comprise epi-polysilicon which is formed on exposed surface of a Si substrate of said SOI wafer.

4. The ground-plane SOI device of claim 3 wherein said Si substrate includes a ground-plane doping region formed therein.

5. A ground-plane silicon-on-insulator (SOI) device having a non-planar buried oxide layer, comprising:
   an implanted ground-plane doping region on a Si substrate of an SOI wafer, said SOI wafer having a buried oxide layer on said Si substrate and a top Si-containing layer on said buried oxide layer, said buried oxide layer having portions thereof being exposed;
   a gate region on portions of said Si-containing layer, said gate region including: a gate dielectric on said Si-containing layer, a gate conductor on said gate dielectric and a hard mask on said gate conductor;
   a halo implanted region and source and drain extension regions in said top Si-containing layer;
   first spacers on said gate dielectric to protect vertical sidewalls of said gate conductor and said hard mask;
   non-planar regions on said exposed portion of said buried oxide layer;
   doped polysilicon spacers overlaying at least said non-planar buried oxide layer;

a lateral undercut region in said Si substrate beneath said gate region; and an oxide liner covering all exposed surfaces of said Si substrate and said lateral undercut region, said oxide liner being formed with oxide filling material that has a combined thickness that is greater than the thickness of non-planar buried oxide layer beneath said gate region.

6. The ground-plane silicon-on-insulator (SOI) device of claim 5, including implanting oxygen at an energy of about 60 ev or below and annealing at a temperature of about 1300° C. or above.

7. The ground-plane silicon-on-insulator (SOI) device of claim 5, wherein said gate dielectric is an oxide, nitride or oxynitride.

8. The ground-plane silicon-on-insulator (SOI) device of claim 5, wherein said gate dielectric is deposited or thermally grown.

9. The ground-plane silicon-on-insulator (SOI) device of claim 5, wherein said gate conductor comprises W, WNi or doped polysilicon or combinations thereof.

10. The ground-plane silicon-on-insulator (SOI) device of claim 5, wherein said gate conductor is doped silicon.

11. The ground-plane silicon-on-insulator (SOI) device of claim 5, wherein said hard mask is an oxide, a carbide or nitride.

12. The ground-plane silicon-on-insulator (SOI) device of claim 5, wherein said undercut region has rounded sidewalls.

* * * * *